US008184030B2

(12) United States Patent
Tseng et al.

(10) Patent No.: US 8,184,030 B2
(45) Date of Patent: May 22, 2012

(54) SOURCE DRIVER NOT INCLUDING ANY P-TYPE DIGITAL-TO-ANALOG CONVERTER

(75) Inventors: Wei-Kai Tseng, Tainan County (TW); Chin-Tien Chang, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 58 days.

(21) Appl. No.: 12/873,332

(22) Filed: Sep. 1, 2010

(65) Prior Publication Data

US 2012/0050083 A1 Mar. 1, 2012

(51) Int. Cl.
*H03M 1/66* (2006.01)

(52) U.S. Cl. .............. 341/144; 345/87; 345/94; 345/96; 345/214; 345/208; 327/108

(58) Field of Classification Search .................. 341/144; 345/87, 94, 96, 100, 214, 211, 208; 327/108
See application file for complete search history.

(56) References Cited

U.S. PATENT DOCUMENTS

| | | | | |
|---|---|---|---|---|
| 6,172,663 | B1 * | 1/2001 | Okada et al. | 345/96 |
| 6,963,328 | B2 * | 11/2005 | Kang et al. | 345/100 |
| 7,006,072 | B2 * | 2/2006 | Ahn | 345/103 |
| 7,030,844 | B2 * | 4/2006 | Kang et al. | 345/87 |
| 7,038,652 | B2 * | 5/2006 | Kang et al. | 345/98 |
| 7,205,972 | B1 * | 4/2007 | Kyeong et al. | 345/98 |
| 7,667,675 | B2 * | 2/2010 | Kyeong et al. | 345/87 |
| 7,746,310 | B2 * | 6/2010 | Ahn | 345/98 |
| 7,902,883 | B2 * | 3/2011 | Hidaka | 327/108 |

* cited by examiner

*Primary Examiner* — Lam T Mai
(74) *Attorney, Agent, or Firm* — Winston Hsu; Scott Margo

(57) ABSTRACT

A source driver includes at least a channel, and the channel includes an N-type digital-to-analog converter (NDAC) and an operational amplifier. The NDAC is utilized for receiving input data and selecting one of a plurality of gamma voltages to generate output data according to the input data. The operational amplifier is coupled to the NDAC, and is utilized for amplifying at least the output data to generate an amplified output data. In addition, the channel does not include any P-type digital-to-analog converter.

12 Claims, 8 Drawing Sheets

SOURCE DRIVER NOT INCLUDING ANY P-TYPE DIGITAL-TO-ANALOG CONVERTER

BACKGROUND OF THE INVENTION

1. Field of the Invention

The present invention relates to a source driver, and more particularly, to a source driver which does not include any P-type digital-to-analog converter.

2. Description of the Prior Art

Please refer to FIG. 1. FIG. 1 is a diagram illustrating a prior art source driver 100. As shown in FIG. 1, the source driver 100 includes two adjacent channels 110 and 120, where the channel 110 includes a P-type digital-to-analog converter (PDAC) 112, an N-type digital-to-analog converter (NDAC) 114 and a buffer amplifier 116, and the channel 120 includes a PDAC 122, an NDAC 124 and a buffer amplifier 126. The PDAC is a digital-to-analog converter whose switches are all implemented by P-type Metal-Oxide-Semiconductors (PMOS), and the NDAC is a digital-to-analog converter whose switches are all implemented by N-type Metal-Oxide-Semiconductors (NMOS). In addition, multiplexers 102, 104 and 106 are respectively coupled between the elements in the two channels 110 and 120, and are used for switching the received signals.

In the operations of the source driver 100, taking the channel 100 as an example and assuming that a supply voltage of the source driver is 18V, the PDAC 112 receives gamma voltages ranging from 9V to 18 V to prevent break-down between the source/drain region and the substrate of the PMOS. The NDAC 114 receives gamma voltages ranging from 0V to 9V to prevent break-down between the source/drain region and the substrate of the NMOS. Then, the PDAC 112 or the NDAC 114 selects one of the gamma voltages according to the input signal $A_0$-$A_{N-1}$ or $B_0$-$B_{N-1}$, and outputs the selected gamma voltage. One of the buffer amplifiers 116 and 126 receives the output signal generated from the PDAC 112 or the NDAC 114 and outputs the buffered output signal Vout_1 or Vout_2.

In addition, because each channel included in the prior art source driver 100 has a PDAC and an NDAC, the source driver 100 requires a large chip area due to the design rule of the PDAC and NDAC, causing higher cost of the source driver 100. Furthermore, each buffer amplifier included in the prior art source driver 100 needs to be implemented by a rail-to-rail operational amplifier whose deviation of a head/tail voltage is great, causing poor quality of the amplified signal.

SUMMARY OF THE INVENTION

It is therefore an objective of the present invention to provide a source driver having a smaller chip area to reduce the cost of the source driver.

According to one embodiment of the present invention, a source driver comprises at least a channel, and the channel comprises an N-type digital-to-analog converter (NDAC) and an operational amplifier. The NDAC is utilized for receiving input data and selecting one of a plurality of gamma voltages to generate output data according to the input data. The operational amplifier is coupled to the NDAC, and is utilized for amplifying at least the output data to generate an amplified output data. In addition, the channel does not include any P-type digital-to-analog converter.

According to another embodiment of the present invention, a source driver comprises at least a channel, and the channel comprises a digital-to-analog converter and an operational amplifier. The digital-to-analog converter is utilized for receiving input data and selecting one of a plurality of gamma voltages to generate output data according to the input data. The operational amplifier is coupled to the digital-to-analog converter, and is utilized for amplifying at least the output data to generate an amplified output data. In addition, each of the plurality of gamma voltages is lower than half of a supply voltage of the source driver.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
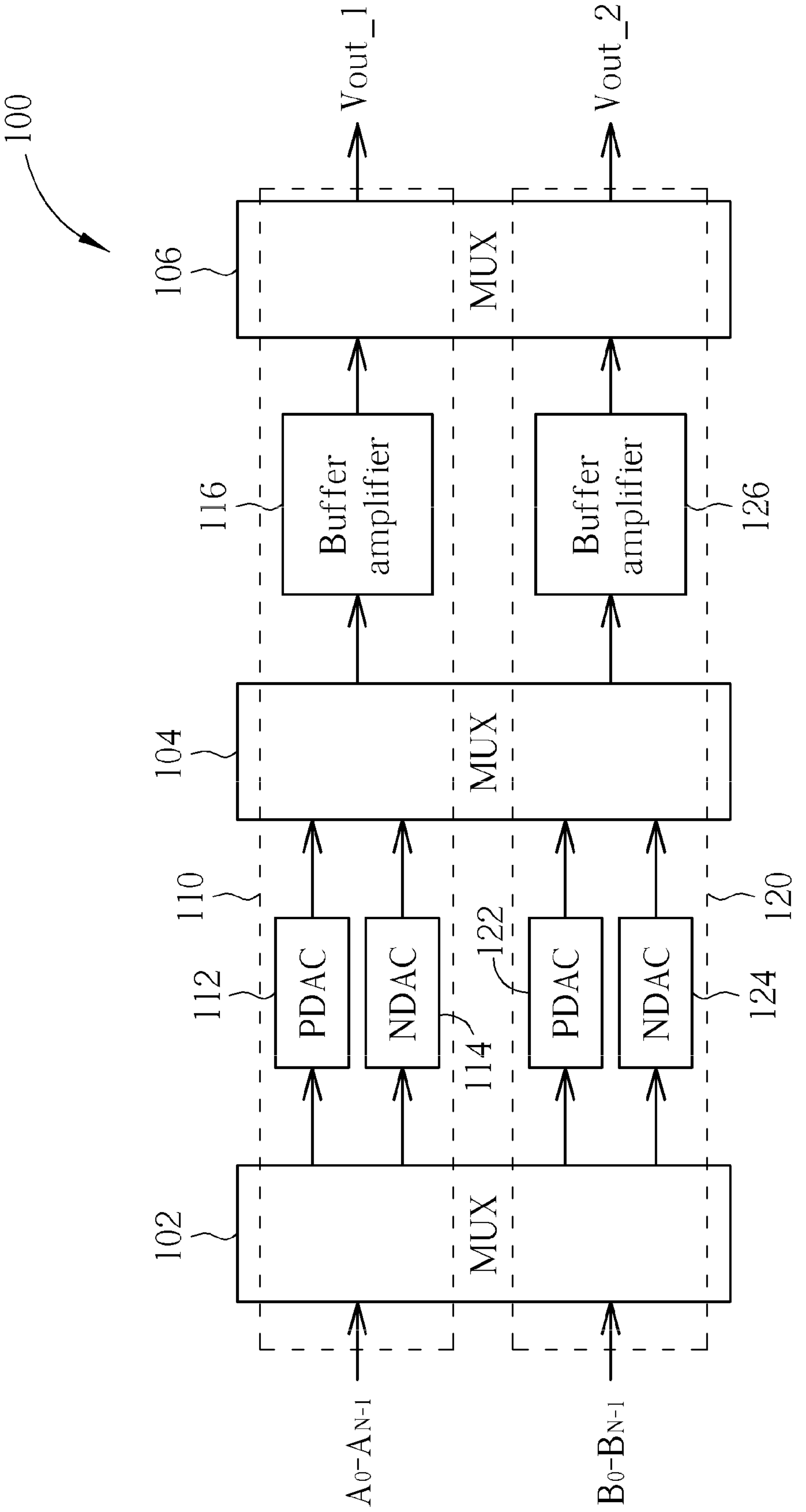
FIG. 1 PRIOR ART
FIG. 1 is a diagram illustrating a prior art source driver.
Figure 2:
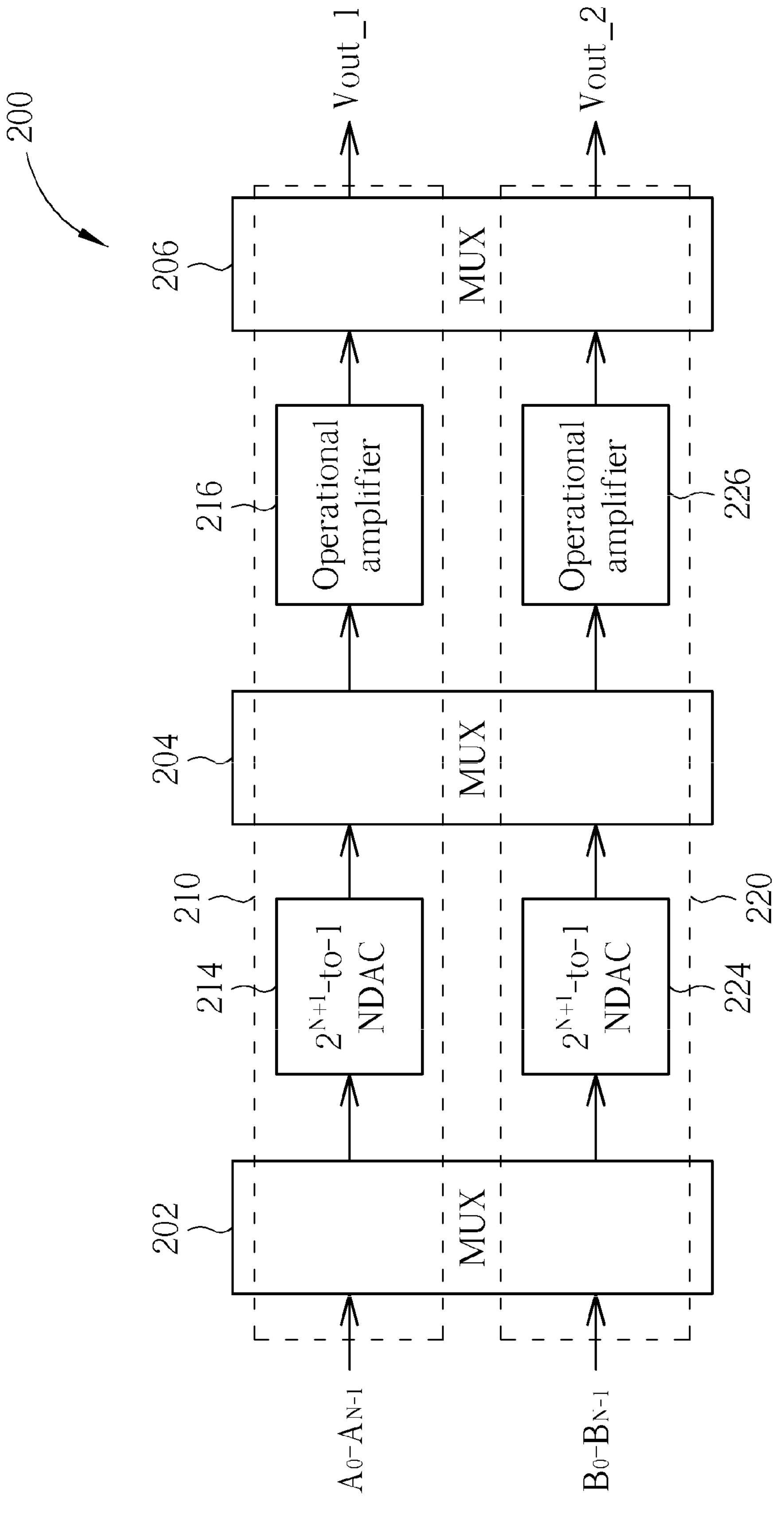
FIG. 2 is a diagram illustrating a source driver according to a first embodiment of the present invention.

Please refer to FIG. 2. FIG. 2 is a diagram illustrating a source driver 200 according to a first embodiment of the present invention. As shown in FIG. 2, the source driver 200 comprises two channels 210 and 220, where the channel 210 includes an N-type digital-to-analog converter (NDAC) 214 and an operational amplifier 216, and the channel 220 includes an NDAC 224 and an operational amplifier 226, and the NDAC is a digital-to-analog converter whose switches are all implemented by N-type Metal-Oxide-Semiconductors (NMOS). In addition, multiplexers 202, 204 and 206 are respectively coupled between the elements in the two channels 210 and 220, and are used for switching the received signals. In addition, the NDAC 214 and the NDAC 224 are $2^{N+1}$-to-1 NDACs, where N is a bit number of the input data $A_0$-$A_{N-1}$ and $B_0$-$B_{N-1}$. Furthermore, gains of the operational amplifiers 216 and 226 are equal to M which is a positive integer greater than 1.

In addition, in other embodiment, the source driver 200 can comprise level shifters connected to the multiplexer 202 to shift the voltage level of the input data $A_0$-$A_{N-1}$ and $B_0$-$B_{N-1}$, and the NDAC 214 and the NDAC 224 receive the level shifted $A_0$-$A_{N-1}$ and $B_0$-$B_{N-1}$, respectively.

The source driver 200 is applied to a display apparatus using a row-inversion driving method.

Figure 3:
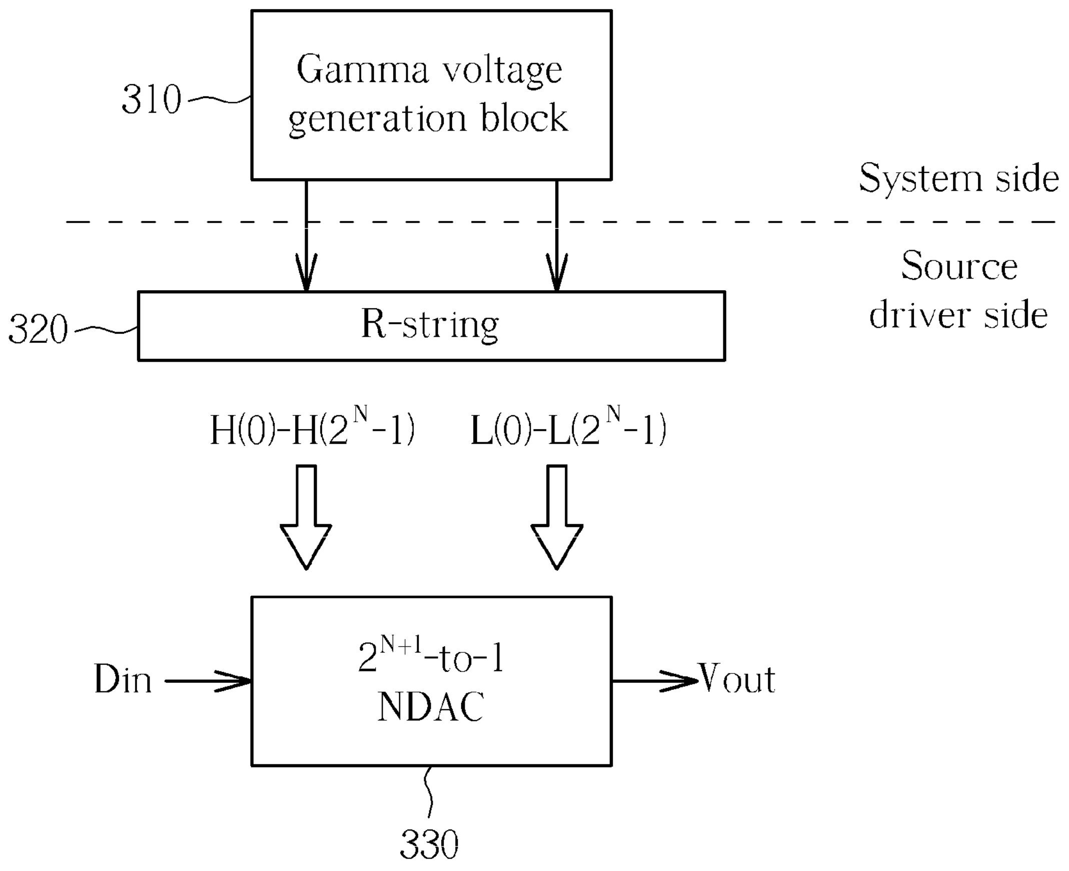
FIG. 3 is a diagram illustrating gamma voltages inputted into each NDAC included in the source driver shown in FIG. 2.

Please refer to FIG. 3. FIG. 3 is a diagram illustrating gamma voltages inputted into each NDAC 330 (i.e., the NDACs 214 and 224 shown in FIG. 2) included in the source driver 200. As shown in FIG. 3, the gamma voltage generation block 310 in the system side generates several reference gamma voltages (such as 18 gamma voltages), and the resistor string (R-string) 320 receives the reference gamma voltages to generate gamma voltages H(0)-H($2^N-1$) and L(0)-L($2^N-1$), where the reference gamma voltages and the gamma voltages H(0)-H($2^N-1$) and L(0)-L($2^N-1$) are lower than (1/M) of the supply voltage of the source driver 200. The NDAC 330 receives the gamma voltages H(0)-H($2^N-1$) and L(0)-L($2^N-1$), and outputs one of the gamma voltages H(0)-H($2^N-1$) and L(0)-L($2^N-1$) as an output Vout of the NDAC 330 according to input data Din, where the input data Din here can be $A_0$-$A_{N-1}$, $B_0$-$B_{N-1}$, level shifted $A_0$-$A_{N-1}$ or level shifted $B_0$-$B_{N-1}$ outputted from the multiplexer 202 shown in FIG. 2. In addition, the gamma voltages H(0)-H($2^N-1$) are for driving the pixel with positive polarization, and the gamma voltages L(0)-L($2^N-1$) are for driving the pixel with negative polarization.

Compared with the prior art source driver 100, because all the gamma voltages H(0)-H($2^N-1$) and L(0)-L($2^N-1$) inputted into the NDACs 214 and 224 are reduced to be about (1/M) of their desired values, the channels 210 and 220 do not need to have any P-type digital-to-analog converter (PDAC). Therefore, the cost of the source driver 200 can be reduced because a chip area of the source driver 200 is less than that of the prior art source driver 100. In addition, because the gamma voltages outputted from the NDACs 214 and 224 are lower than half of the supply voltage, the operational amplifiers 216 and 226 do not need to be implemented by rail-to-rail operational amplifiers, and deviation of a head/tail voltage outputted from the operational amplifiers 216 and 226 will not be greater than the middle voltage, causing better quality of the amplified signal than in the conventional art.

In the operations of the source driver 200, because the gamma voltages outputted from the NDACs 214 and 224 are about (1/M) of their desired values, the operational amplifiers 216 and 226 further amplify the gamma voltages outputted from the NDACs 214 and 224 to the scale of M to generate output data Vout_1 and Vout_2, respectively.

Take N=10, M=2 and a supply voltage of 18V as an example to describe the operations of the source driver 200 in more detail. The NDACs 214 and 224 receive the gamma voltages H(0)-H(1023) and L(0)-L(1023) whose voltage values are lower than 9V (a range of these gamma voltages is about 02V-8.8V), and the NDACs 214 and 224 generate one of the gamma voltages H(0)-H(1023) and L(0)-L(1023) according to the input data $A_0$-$A_9$ and $B_0$-$B_9$, respectively. Then, the operational amplifiers 216 and 226 double the gamma voltages outputted from the NDACs 214 and 224 to generate output data Vout_1 and Vout_2, respectively.

Figure 4:
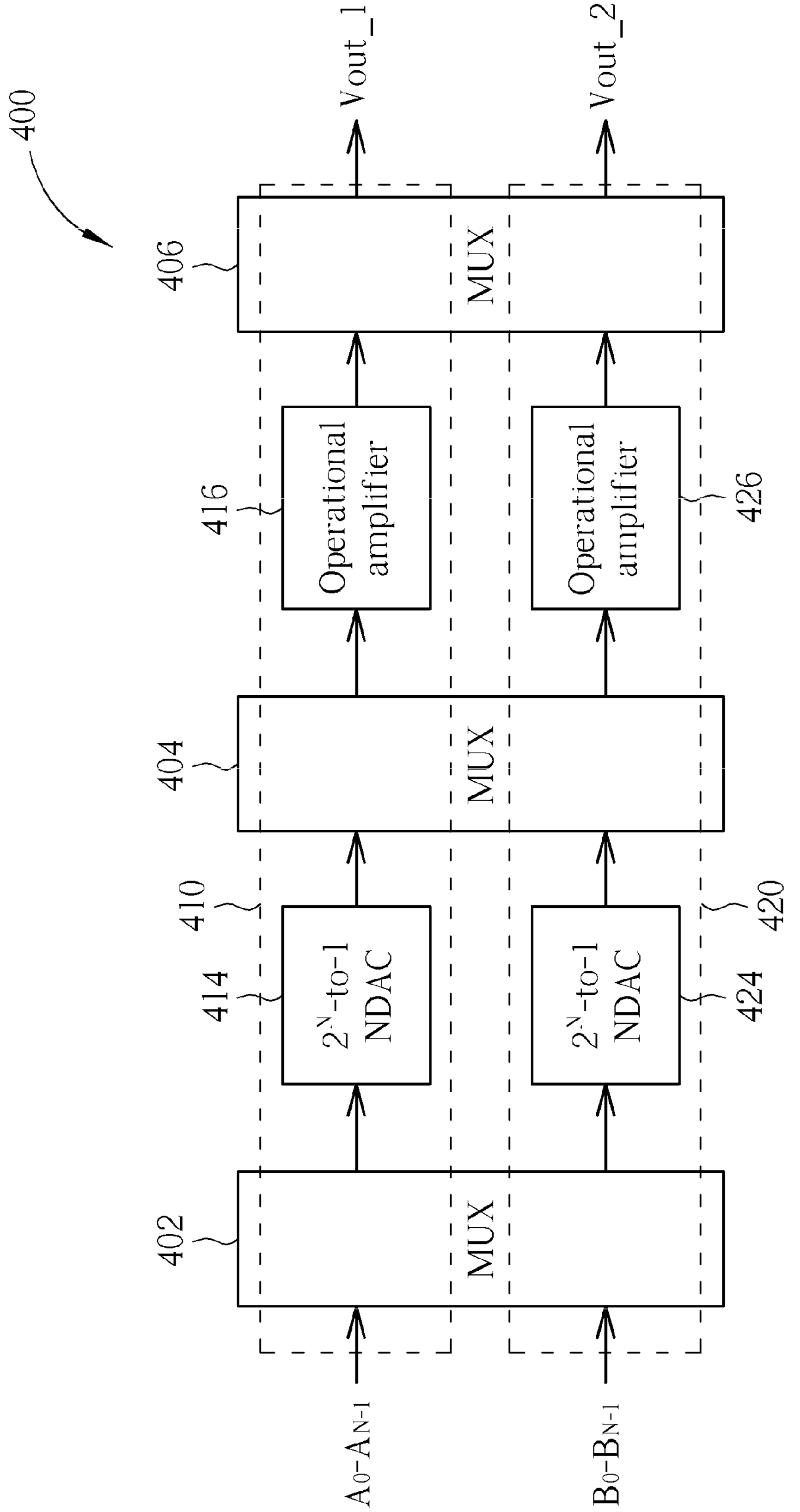
FIG. 4 is a diagram illustrating a source driver according to a second embodiment of the present invention.

Please refer to FIG. 4. FIG. 4 is a diagram illustrating a source driver 400 according to a second embodiment of the present invention. As shown in FIG. 4, the source driver 400 comprises two channels 410 and 420, where the channel 410 includes an NDAC 414 and an operational amplifier 416, and the channel 420 includes an NDAC 424 and an operational amplifier 426, and the NDAC is a digital-to-analog converter whose switches are all implemented by NMOS. In addition, multiplexer 402, 404 and 406 are respectively coupled between the elements in the two channels 410 and 420, and are used for switching the received signals. In addition, the NDAC 414 and the NDAC 424 are $2^N$-to-1 NDACs, where N is a bit number of the input data $A_0$-$A_{N-1}$ and $B_0$-$B_{N-1}$. Furthermore, gains of the operational amplifiers 416 and 426 are equal to M which is a positive integer greater than 1.

In addition, in other embodiment, the source driver 400 can comprise level shifters connected to the multiplexer 402 to shift the voltage level of the input data $A_0$-$A_{N-1}$ and $B_0$-$B_{N-1}$, and the NDAC 414 and the NDAC 424 receive the level shifted $A_0$-$A_{N-1}$ and $B_0$-$B_{N-1}$, respectively.

The source driver 400 is applied to a display apparatus using a row-inversion driving method.

Figure 5A:
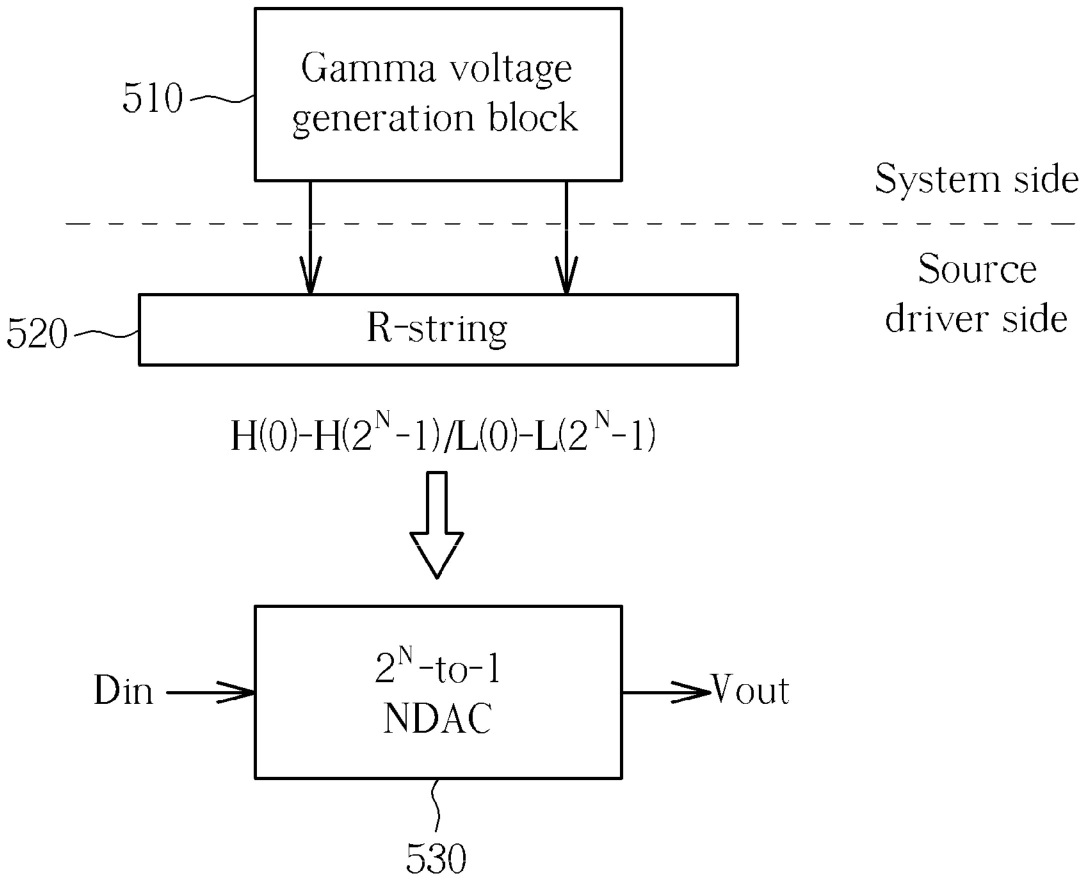
FIG. 5A is a diagram illustrating gamma voltages inputted into each NDAC included in the source driver shown in FIG. 4.
Figure 5B:
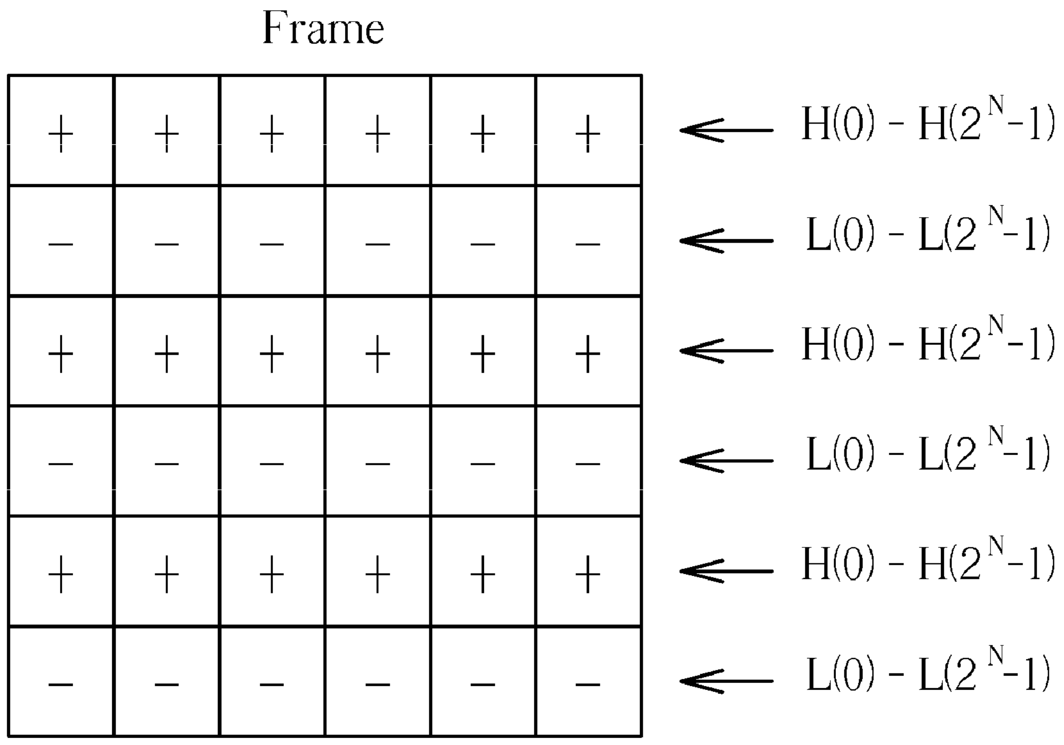
FIG. 5B is a diagram illustrating that the gamma voltages H(0)-H($2^N-1$) shown in FIG. 5A are for driving the pixel with positive polarization, and the gamma voltages L(0)-L($2^N-1$) shown in FIG. 5A are for driving the pixel with negative polarization.

Please refer to FIG. 5A. FIG. 5A is a diagram illustrating gamma voltages inputted into each NDAC 530 (i.e., the NDACs 414 and 424 shown in FIG. 4) included in the source driver 400. As shown in FIG. 5A, when the channel is under a first mode, the gamma voltage generation block 510 in the system side generates several first reference gamma voltages (such as 9 reference gamma voltages), and the resistor string (R-string) 520 receives the reference gamma voltages to generate gamma voltages H(0)-H($2^N-1$), where the first reference gamma voltages and the gamma voltages H(0)-H($2^N-1$) are lower than (1/M) of the supply voltage of the source driver 400. The NDAC 530 receives the gamma voltages H(0)-H($2^N-1$), and outputs one of the gamma voltages H(0)-H($2^N-1$) as an output Vout of the NDAC 530 according to input data Din, where the input data Din here can be $A_0$-$A_{N-1}$, $B_0$-$B_{N-1}$, level shifted $A_0$-$A_{N-1}$ or level shifted $B_0$-$B_{N-1}$ outputted from the multiplexer 402 shown in FIG. 4. In addition, when the channel is under a second mode, the gamma voltage generation block 510 in the system side generates several second reference gamma voltages (such as 9 reference gamma voltages) different from the first reference gamma voltages, and the R-string 520 receives the reference gamma voltages to generate gamma voltages L(0)-L($2^N-1$) different from the gamma voltages H(0)-H($2^N-1$), where the second reference gamma voltages and the gamma voltages L(0)-L($2^N-1$) are lower than (1/M) of the supply voltage of the source driver 400. The NDAC 530 receives the gamma voltages L(0)-L($2^N-1$), and outputs one of the gamma voltages L(0)-L($2^N-1$) as an output Vout of the NDAC 530 according to the input data Din. In addition, in this embodiment, each of the gamma voltages H(0)-H($2^N-1$) is greater than each of the gamma voltages L(0)-L($2^N-1$), and the gamma voltages H(0)-H($2^N-1$) are for driving the pixel with positive polarization, and the gamma voltages L(0)-L($2^N-1$) are for driving the pixel with negative polarization as shown in FIG. 5B. Please note that the frame shown in FIG. 5B is for illustrative purposes only, and is not a limitation of the present invention.

Compared with the prior art source driver 100, because all the gamma voltages H(0)-H($2^N-1$)/L(0)-L($2^N-1$) inputted into the NDACs 414 and 424 are reduced to be about (1/M) of their desired values, the channels 410 and 420 do not need to have any P-type digital-to-analog converter (PDAC). Therefore, the cost of the source driver 400 can be reduced because a chip area of the source driver 400 is less than that of the prior art source driver 100. In addition, because the gamma voltages outputted from the NDACs 414 and 424 are lower than half of the supply voltage, the operational amplifiers 416 and 426 do not need to be implemented by rail-to-rail operational amplifiers, and the deviation of the head/tail voltage outputted from the operational amplifiers 416 and 426 will not be greater than the middle voltage, causing better quality of the amplified signal than in the conventional art.

In the operations of the source driver 400, because the gamma voltages outputted from the NDACs 414 and 424 are about (1/M) of their desired values, the operational amplifiers 416 and 426 further amplify the gamma voltages outputted from the NDACs 414 and 424 to the scale of M to generate output data Vout_1 and Vout_2, respectively.

Figure 6:
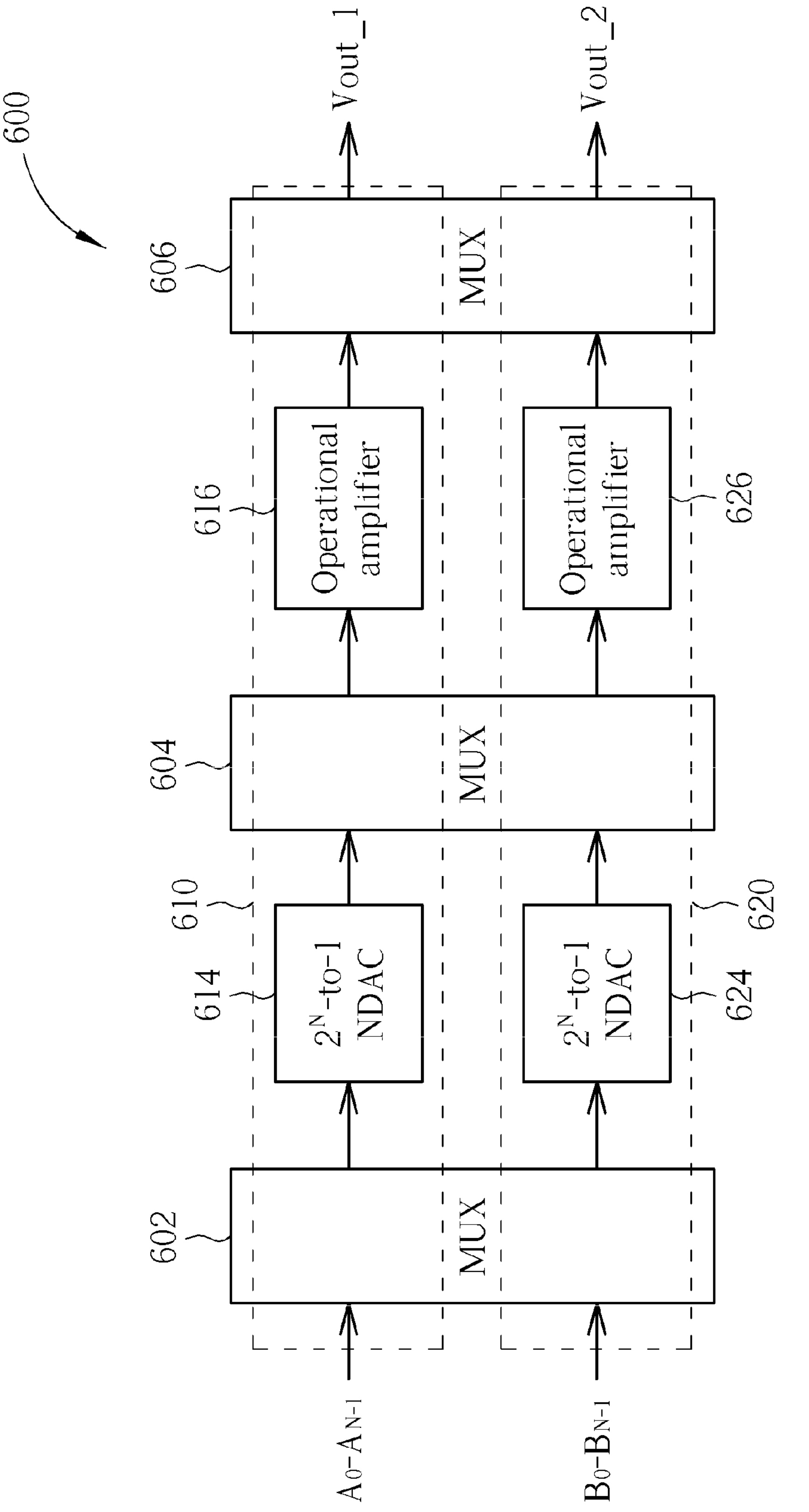
FIG. 6 is a diagram illustrating a source driver according to a third embodiment of the present invention.

Please refer to FIG. 6. FIG. 6 is a diagram illustrating a source driver 600 according to a third embodiment of the present invention. As shown in FIG. 6, the source driver 600 comprises two channels 610 and 620, where the channel 610 includes an NDAC 614 and an operational amplifier 616, and the channel 620 includes an NDAC 624 and an operational amplifier 626, and the NDAC is a digital-to-analog converter whose switches are all implemented by NMOS. In addition, multiplexers 602, 604 and 606 are respectively coupled between the elements in the two channels 610 and 620, and are used for switching the received signals. In addition, the NDAC 614 and the NDAC 624 are $2^N$-to-1 NDACs, where N is a bit number of the input data $A_0$-$A_{N-1}$ and $B_0$-$B_{N-1}$. Furthermore, gains of the operational amplifiers 616 and 626 are equal to M which is a positive integer greater than 1.

In addition, in other embodiment, the source driver 600 can comprise level shifters connected to the multiplexer 602 to shift the voltage level of the input data $A_0$-$A_{N-1}$ and $B_0$-$B_{N-1}$, and the NDAC 614 and the NDAC 624 receive the level shifted $A_0$-$A_{N-1}$ and $B_0$-$B_{N-1}$, respectively.

The source driver 600 is applied to a display apparatus using a row-inversion driving method.

Figure 7:
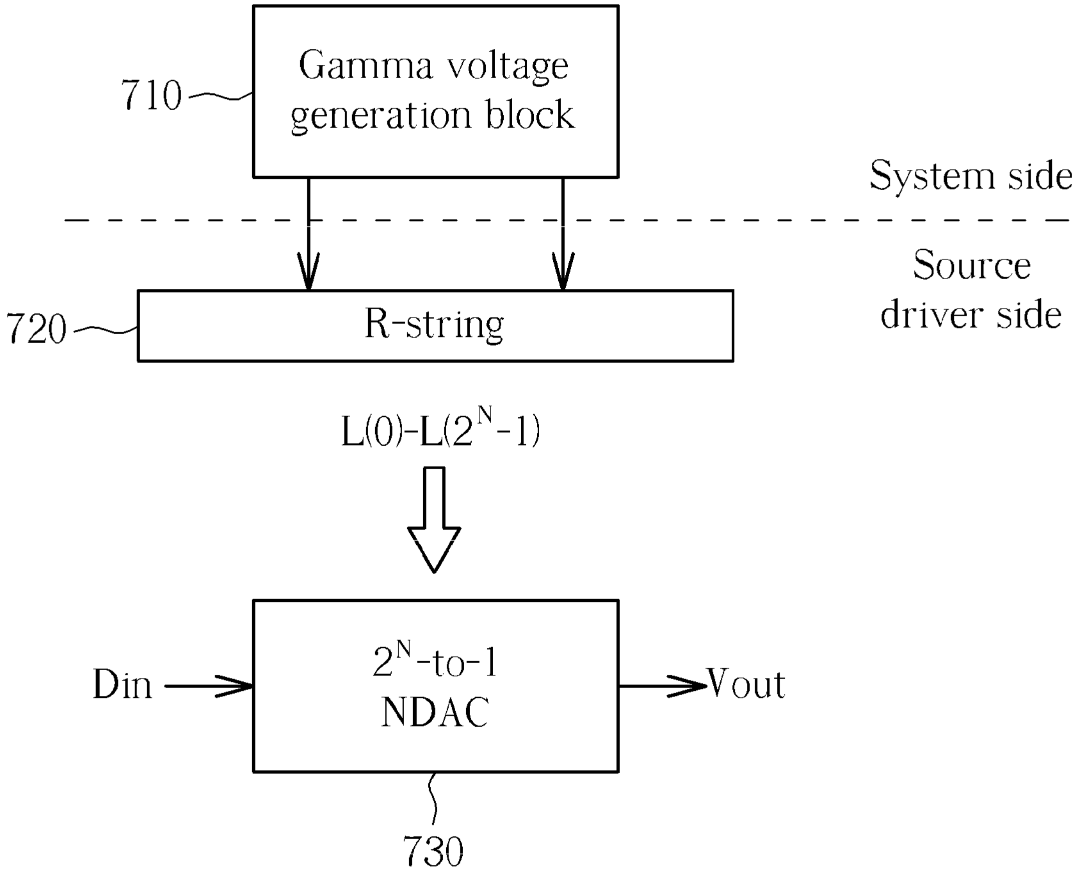
FIG. 7 is a diagram illustrating gamma voltages inputted into each NDAC included in the source driver shown in FIG. 6.

Please refer to FIG. 7. FIG. 7 is a diagram illustrating gamma voltages inputted into each NDAC 730 (i.e., the NDACs 614 and 624 shown in FIG. 6) included in the source driver 600. As shown in FIG. 7, the gamma voltage generation block 710 in the system side generates several reference gamma voltages (such as 9 reference gamma voltages), and the resistor string (R-string) 720 receives the reference gamma voltages to generate gamma voltages L(0)-L($2^N$−1), where each of the gamma voltages L(0)-L($2^N$−1) is for driving the pixel with negative polarization, and the reference gamma voltages and the gamma voltages L(0)-L($2^N$−1) are lower than (1/M) of the supply voltage of the source driver 600. The NDAC 730 receives the gamma voltages L(0)-L($2^N$−1), and outputs one of the gamma voltages L(0)-L($2^N$−1) as an output Vout of the NDAC 730 according to input data Din, where the input data Din here can be $A_0$-$A_{N-1}$, $B_0$-$B_{N-1}$, level shifted $A_0$-$A_{N-1}$ or level shifted $B_0$-$B_{N-1}$ outputted from the multiplexer 602 shown in FIG. 6.

In the operations of the source driver 600, taking the channel 610 as an example, when the channel 610 is under a first mode and the channel 610 needs to output the output data Vout_1 to drive the pixel with positive polarization, the operational amplifier 616 amplifies one of the gamma voltages L(0)-L($2^N$−1) outputted from the NDAC 614 or 624 with an offset by a scale M to generate an output signal Vout_1; that is the output of the operational amplifier 616 is M*(offset−L(i)), where L(i) is one of the gamma voltages L(0)-L($2^N$−1). It is noted that the calculation (offset−L(i)) is for generating a gamma voltage H(i) similar to one of the gamma voltages H(0)-H($2^N$−1) shown in FIG. 3 and FIG. 5A. In addition, when the channel 610 is under a second mode and the channel 610 needs to output the output data Vout_1 to drive the pixel with negative polarization, the operational amplifier 616 amplifies one of the gamma voltages L(0)-L($2^N$−1) to the scale of M to generate the output signal Vout_1.

Compared with the prior art source driver 100, the cost of the source driver 600 can be reduced because a chip area of the source driver 600 is less than that of the prior art source driver 100, and the operational amplifiers 616 and 626 do not need to be implemented by rail-to-rail operational amplifiers. Furthermore, the system side only needs to provide half of the reference gamma voltages.

Briefly summarized, the source driver of the present invention uses the NDAC to output the gamma voltages, and does not include any PDAC. Therefore, the chip area of the source driver is smaller, and the cost of the source driver can be reduced.

Those skilled in the art will readily observe that numerous modifications and alterations of the device and method may be made while retaining the teachings of the invention.

What is claimed is:

1. A source driver, comprising:
at least a channel, comprising:
an N-type digital-to-analog converter (NDAC), for receiving input data and selecting one of a plurality of gamma voltages to generate output data according to the input data; and
an operational amplifier, coupled to the NDAC, for amplifying at least the output data to generate an amplified output data;
wherein the channel does not include any P-type digital-to-analog converter, and each of the plurality of gamma voltages is lower than half of a supply voltage of the source driver.

2. The source driver of claim 1, wherein the NDAC is a $2^{N+1}$-to-1 NDAC, where N is a bit number of the input data.

3. The source driver of claim 1, wherein the plurality of gamma voltages are lower than (1/M) of the supply voltage of the source driver, and a gain of the operational amplifier is equal to M which is a positive integer greater than 1.

4. The source driver of claim 1, wherein the plurality of gamma voltages include first gamma voltages and second gamma voltages; when the channel is under a first mode, the NDAC receives the first gamma voltages and does not receive the second gamma voltages, and selects one of the first gamma voltages to generate the output data according to the input data; and when the channel is under a second mode, the NDAC receives the second gamma voltages and does not receive the first gamma voltages, and selects one of the second gamma voltages to generate the output data according to the input data.

5. The source driver of claim 4, wherein the NDAC is a $2^N$-to-1 NDAC, a number of the first gamma voltages is $2^N$, and a number of the second gamma voltages is $2^N$, where N is a bit number of the input data.

6. The source driver of claim 4, wherein the plurality of gamma voltages are lower than (1/M) of the supply voltage of the source driver, and a gain of the operational amplifier is equal to M which is a positive integer greater than 1.

7. The source driver of claim 4, wherein each of the first gamma voltages is greater than each of the second gamma voltages.

8. The source driver of claim 1, wherein the NDAC is a $2^N$-to-1 NDAC, a number of the gamma voltages is $2^N$, where N is a bit number of the input data; when the channel is under a first mode, the operational amplifier amplifies the output data with an offset to generate the amplified output data; and when the channel is under a second mode, the operational amplifier amplifies the output data to generate the amplified output data.

9. The source driver of claim 1, applied to a display apparatus using a row-inversion driving method.

10. A source driver, comprising:

at least a channel, comprising:

a digital-to-analog converter, for receiving input data and selecting one of a plurality of gamma voltages to generate output data according to the input data; and an operational amplifier, coupled to the digital-to-analog converter, for amplifying at least the output data to generate an amplified output data;

wherein each of the plurality of gamma voltages is lower than half of a supply voltage of the source driver.

11. The source driver of claim 10, wherein the plurality of gamma voltages are lower than (1/M) of the supply voltage of the source driver, and a gain of the operational amplifier is equal to M which is a positive integer greater than 1.

12. The source driver of claim 11, applied to a display apparatus using a row-inversion driving method.

* * * * *